United States Patent [19]
Young

[11] Patent Number: 6,020,776
[45] Date of Patent: Feb. 1, 2000

[54] EFFICIENT MULTIPLEXER STRUCTURE FOR USE IN FPGA LOGIC BLOCKS

[75] Inventor: Steven P. Young, San Jose, Calif.

[73] Assignee: Xilinx, Inc., San Jose, Calif.

[21] Appl. No.: 09/102,711

[22] Filed: Jun. 22, 1998

[51] Int. Cl.[7] .................................................. H03K 17/693
[52] U.S. Cl. ............................ 327/408; 327/565; 326/41
[58] Field of Search ..................................... 327/407, 408, 327/441, 564, 565, 566; 326/39, 41, 44, 47, 101, 102, 103

[56] References Cited

U.S. PATENT DOCUMENTS

| | | | |
|---|---|---|---|
| 3,614,327 | 10/1971 | Easton et al. | 179/15 A |
| 4,551,634 | 11/1985 | Takahashi et al. | 327/408 |
| 4,692,634 | 9/1987 | Fang et al. | 327/203 |
| 5,030,861 | 7/1991 | Hoffman et al. | 327/410 |
| 5,315,178 | 5/1994 | Snider | 326/44 |
| 5,418,480 | 5/1995 | Hastie et al. | 326/113 |
| 5,419,367 | 5/1995 | Chan et al. | 326/44 |
| 5,436,574 | 7/1995 | Veenstra | 326/39 |
| 5,438,295 | 8/1995 | Reddy et al. | 327/408 |
| 5,570,051 | 10/1996 | Chiang et al. | 327/203 |
| 5,682,107 | 10/1997 | Tavana et al. | 326/41 |
| 5,744,995 | 4/1998 | Young | 327/407 |
| 5,861,761 | 1/1999 | Kean | 326/41 |

Primary Examiner—Tuan T. Lam
Attorney, Agent, or Firm—E. Eric Hoffman, Esq.; Bever & Hoffman; Lois D. Cartier

[57] ABSTRACT

The invention provides a multiplexer structure having an efficient quadrilateral layout. The multiplexer structure includes a first multiplexer and a second multiplexer, both being coupled to receive a plurality of common input signals. Each multiplexer has a first stage and a second stage. The first stages of the first and second multiplexers are fabricated in a plurality of adjacent multiplexer stripes. Each multiplexer stripe includes a plurality of interleaved pass transistors. The multiplexer stripes are fabricated in parallel with each other along a first axis. Gate electrodes of the pass transistors extend in parallel with each other along a second axis that is perpendicular to the first axis. One or more rows of memory cells extend along the second axis, adjacent to the multiplexer stripes. These memory cells control the pass transistors in the multiplexer stripes. The second stages of the first and second multiplexers are fabricated in a multiplexer row, which extends along the second axis and includes a plurality of interleaved pass transistors. One or more additional rows of memory cells extend along the second axis, adjacent to the multiplexer row. These memory cells control the pass transistors in the multiplexer row. The multiplexer stripes, memory cell rows, and multiplexer row all have quadrilateral layouts. In addition, the entire multiplexer structure has a quadrilateral layout.

10 Claims, 8 Drawing Sheets

EFFICIENT MULTIPLEXER STRUCTURE FOR USE IN FPGA LOGIC BLOCKS

CROSS-REFERENCE TO RELATED APPLICATIONS

This application relates to the commonly assigned U.S. patent application Ser. No. 08/806,997 now U.S. Pat. No. 5,914,616, invented by Steven P. Young et al, entitled "FPGA Repeatable Interconnect Structure with Hierarchical Interconnect Lines", which is incorporated herein by reference.

FIELD OF THE INVENTION

The present invention relates to a multiplexer structure having a compact and regular layout area. Such a multiplexer structure can be used in integrated circuits, such as field programmable gate arrays (FPGAs) or other programmable logic devices.

BACKGROUND OF THE INVENTION

Multiplexers are commonly used to selectively route signals in integrated circuit devices. Many integrated circuit devices, such as field programmable gate arrays (FPGAs) and other programmable logic devices, use a relatively large number of multiplexers. FPGAs typically include a large number of multiplexers because of the large amount of replicated circuitry present in the FPGA. For example, a typical FPGA may include an array of identical configurable logic blocks (CLBs), a largely repetitive programmable interconnect structure and a plurality of identical input/output blocks (IOBs). Because one or more multiplexers are typically present in each CLB, each IOB, and each repeated segment of the programmable interconnect structure, the number of multiplexers present in the FPGA becomes quite large.

It is therefore desirable to minimize the layout area of multiplexers. It is also desirable to have a multiplexer with a regular layout shape, such that the multiplexer can be easily laid out with respect to other circuit elements of an integrated circuit. It is also desirable for a multiplexer to have a minimum delay path, such that signals transmitted through the multiplexer have a minimum associated delay.

There are many types of conventional multiplexers, one of which is described by Young in commonly assigned U.S. Pat. No. 5,744,995 [docket X-230], which is incorporated herein by reference. Other conventional multiplexers are described, for example, in U.S. Pat. Nos. 5,416,367, 4,551,634, 5,438,295, 4,692,634, 5,436,574, 5,418,480, 5,030,861, 3,614,327, and 5,570,051, all of which are incorporated herein by reference.

SUMMARY OF THE INVENTION

The present invention provides a multiplexer structure having a compact quadrilateral layout, e.g., a layout generally rectangular in shape. In accordance with one embodiment, the multiplexer structure includes a first multiplexer and a second multiplexer, both being coupled to receive a plurality of common input signals. In addition to the common input signals, the first and second multiplexers can be coupled to receive one or more unique signals. Each multiplexer has a first stage and a second stage. The first stages of the first and second multiplexers are fabricated in a plurality of adjacent multiplexer stripes. Each multiplexer stripe includes a plurality of interleaved pass transistors, such that transistors associated with both the first and second multiplexers are fabricated in each multiplexer stripe. The multiplexer stripes are fabricated in parallel with each other along a first axis. Gate electrodes of the pass transistors extend in parallel with each other along a second axis that is perpendicular to the first axis.

One or more rows of memory cells extend along the second axis, adjacent to the multiplexer stripes. These memory cells control the pass transistors in the multiplexer stripes by applying control signals to the gate electrodes of the pass transistors. In one embodiment, the memory cells are static random access memory (SRAM) cells that are programmed during the configuration of an FPGA.

The second stages of the first and second multiplexers are fabricated in a multiplexer row, which extends along the second axis and includes a plurality of interleaved pass transistors. One or more additional rows of memory cells extend along the second axis, adjacent to the multiplexer row. These memory cells provide control signals that control the pass transistors in the multiplexer row.

The multiplexer stripes, the multiplexer row, and the rows of memory cells all have quadrilateral layouts. In addition, the entire multiplexer structure has a quadrilateral layout.

BRIEF DESCRIPTION OF THE DRAWINGS

The present invention will be more fully understood in view of the following description and drawings.

DETAILED DESCRIPTION OF THE DRAWINGS

Figure 1:
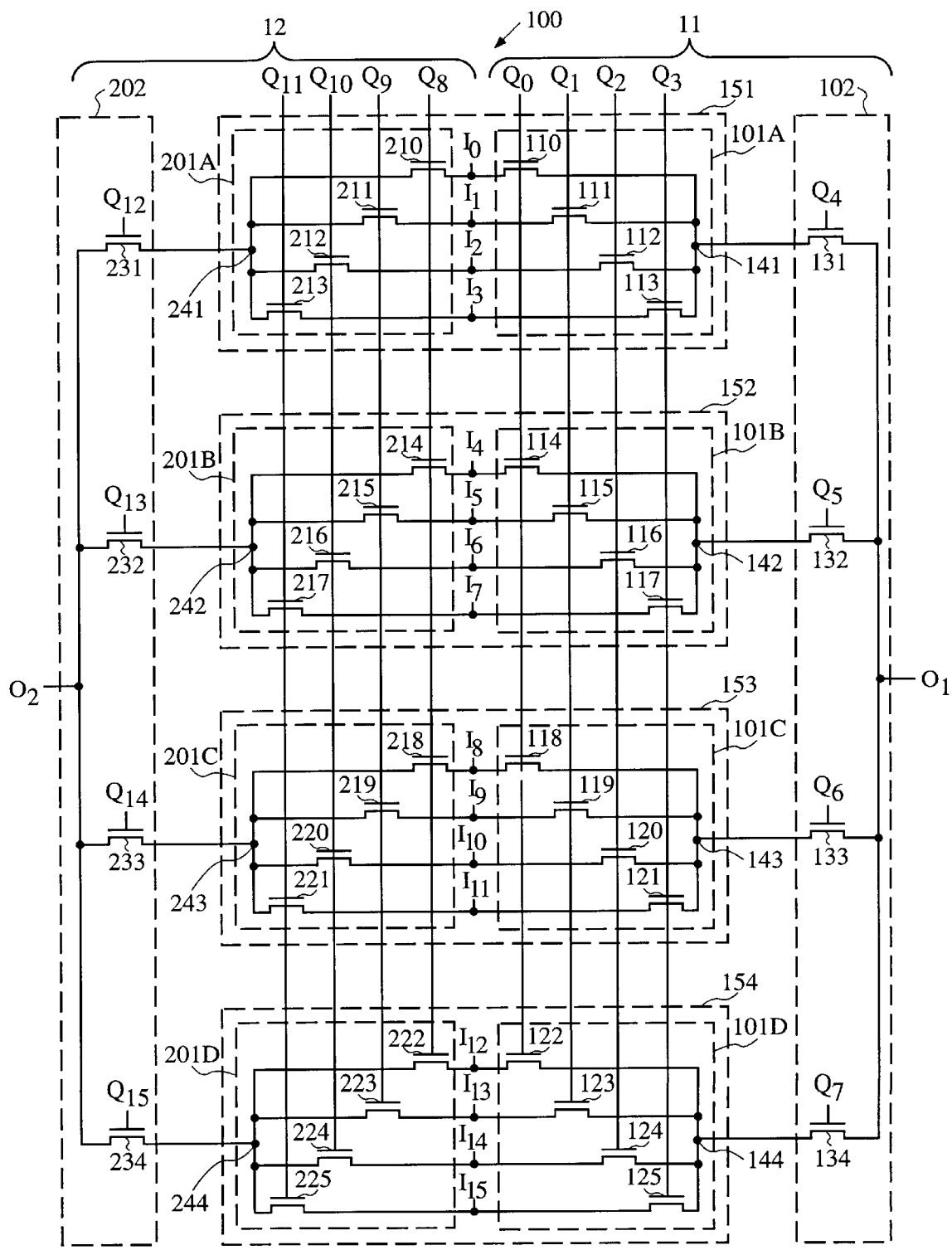
FIG. 1 is a schematic diagram of a multiplexer structure in accordance with one embodiment of the present invention.

FIG. 1 is a schematic diagram of a multiplexer structure 100 in accordance with one embodiment of the present invention. Multiplexer structure 100 includes two 16-to-1 multiplexers 11 and 12, which are coupled in a back-to-back configuration. In this configuration, each of the 16-to-1 multiplexers 11–12 is coupled to receive the same sixteen input signals $I_0$–$I_{15}$. The first 16-to-1 multiplexer 11 is controlled to route one of the sixteen input signals $I_0$–$I_{15}$ as a first output signal $O_1$, and the second 16-to-1 multiplexer 12 is controlled to route one of the sixteen input signals $I_0$–$I_{15}$ as a second output signal $O_2$. The first and second multiplexers 11 and 12 are independently controlled, such that any of the input signals $I_0$–$I_{15}$ can be routed as the output signals $O_1$ and $O_2$. In the following description, terminals designated to receive a particular signal are identified by the name of the signal. For example, the terminal designated to receive the first output signal $O_1$ is identified as the $O_1$ output terminal (or output terminal $O_1$).

The first 16-to-1 multiplexer 11 of multiplexer structure 100 is formed by n-channel pass transistors 110–125 and 131–134. Pass transistors 110–125 form a first multiplexer stage, and pass transistors 131–134 form a second multiplexer stage. Pass transistors 110–125 are coupled to receive the input signals $I_0$–$I_{15}$, respectively. Pass transistors 110–125 are coupled to form four 4-to-1 multiplexers 110A–101D. More specifically, pass transistors 110–113, 114–117, 118–121, and 122–125 are coupled to form 4-to-1 multiplexers 101A, 101B, 101C, and 101D, respectively. Transistors 110–113 are commonly connected at terminal 141, which forms the output terminal of 4-to-1 multiplexer 101A. Similarly, transistors 114–117, 118–121, and 122–125 are commonly connected at terminals 142, 143, and 144, respectively, thereby forming the output terminals of 4-to-1 multiplexers 101B, 101C, and 101D, respectively.

Output terminals 141–144 are coupled to pass transistors 131–134, respectively. Transistors 131–134 are commonly connected at the output terminal $O_1$. As a result, transistors 131–134 form a 4-to-1 multiplexer 102. This multiplexer 102 forms the second multiplexer stage of the first 16-to-1 multiplexer 11.

The first 16-to-1 multiplexer 11 is controlled by control signals $Q_0$–$Q_7$. In the described example, control signals $Q_0$–$Q_7$ are provided by static random access memory (SRAM) cells. In this example, these SRAM cells are programmed during the configuration of an associated FPGA. However, in other embodiments, these control signals can be provided by other conventional signal sources. Control signal $Q_0$ is provided to the gates of pass transistors 110, 114, 118, and 122 (i.e., the first pass transistor in each of 4-to-1 multiplexers 101A–101D). Control signal $Q_1$ is provided to the gates of pass transistors 111, 115, 119, and 123. Control signal $Q_2$ is provided to the gates of pass transistors 112, 116, 120, and 124. Control signal $Q_3$ is provided to the gates of pass transistors 113, 117, 121, and 125. Control signals $Q_4$–$Q_7$ are provided to the gates of pass transistors 131–134, respectively.

The first 16-to-1 multiplexer 11 operates as follows. The control signals $Q_0$–$Q_3$ are selected such that one of these control signals is asserted at a logic high level, and the remaining three of these control signals $Q_0$–$Q_3$ are de-asserted at a logic low level. Control signals $Q_4$–$Q_7$ are selected in the same manner, such that one of these control signals is asserted and the remaining three control signals are de-asserted. As a result, one of the sixteen input signals $I_0$–$I_{15}$ is routed through the first 16-to-1 multiplexer 11 as the output signal $O_1$. The propagation delay of any signal routed through first multiplexer 11 is equal to the delay introduced by two of the pass transistors 110–125 and 131–134.

In the schematic representation of FIG. 1, the second 16-to-1 multiplexer 12 is shown as a mirror image of the first 16-to-1 multiplexer 11. The second 16-to-1 multiplexer 12 includes n-channel pass transistors 210–225 and 231–234. Transistors 210–225 are coupled to form 4-to-1 multiplexers 201A–201D, and transistors 231–234 are coupled to form 4-to-1 multiplexer 202. Multiplexers 201A–201D form a first stage of multiplexer 12, and multiplexer 202 forms a second stage of multiplexer 12. Multiplexers 201A–201D have output terminals 241–244, respectively, which are coupled to pass transistors 231–234, respectively. The second 16-to-1 multiplexer is controlled by control signals $Q_8$–$Q_{15}$ Because the second 16-to-1 multiplexer 12 is substantially identical to the first 16-to-1 multiplexer 11, the connections and operation of the second 16-to-1 multiplexer 12 are not described in detail. However, it is noted that the delay of any signal through the second multiplexer 12 is equal to the delay through two of the pass transistors 210–225 and 231–234. Thus, the first multiplexer 11 and the second multiplexer 12 exhibit substantially identical delays.

One application for multiplexer structure 100 is to control the routing of signals in a programmable logic device, such as an FPGA. Prior to its normal operation, the FPGA is configured to form the desired logic circuit. This configuration typically involves the programming of various multiplexers, whereby the programmed multiplexers provide desired connections within the FPGA. One example of an FPGA and its associated programmable circuitry is described by Young et al in commonly assigned co-pending U.S. patent application Ser. No. 08/806,997[docket X-277 US].

In the described example, multiplexer structure 100 can be configured such that one of the input signals $I_0$–$I_{15}$ is routed to the output terminal $O_1$, and one of the input signals $I_0$–$I_{15}$ is routed to the output terminal $O_2$. The same input signal can be routed to both output terminal $O_1$ and output terminal $O_2$, if desired.

In accordance with one embodiment of the present invention, multiplexer structure 100 is laid out on a semiconductor substrate in a manner that is efficient in terms of the layout area consumed. This layout is also regular in nature, such that multiplexer structure 100 can be easily laid out with respect to other circuit elements.

Figure 2:
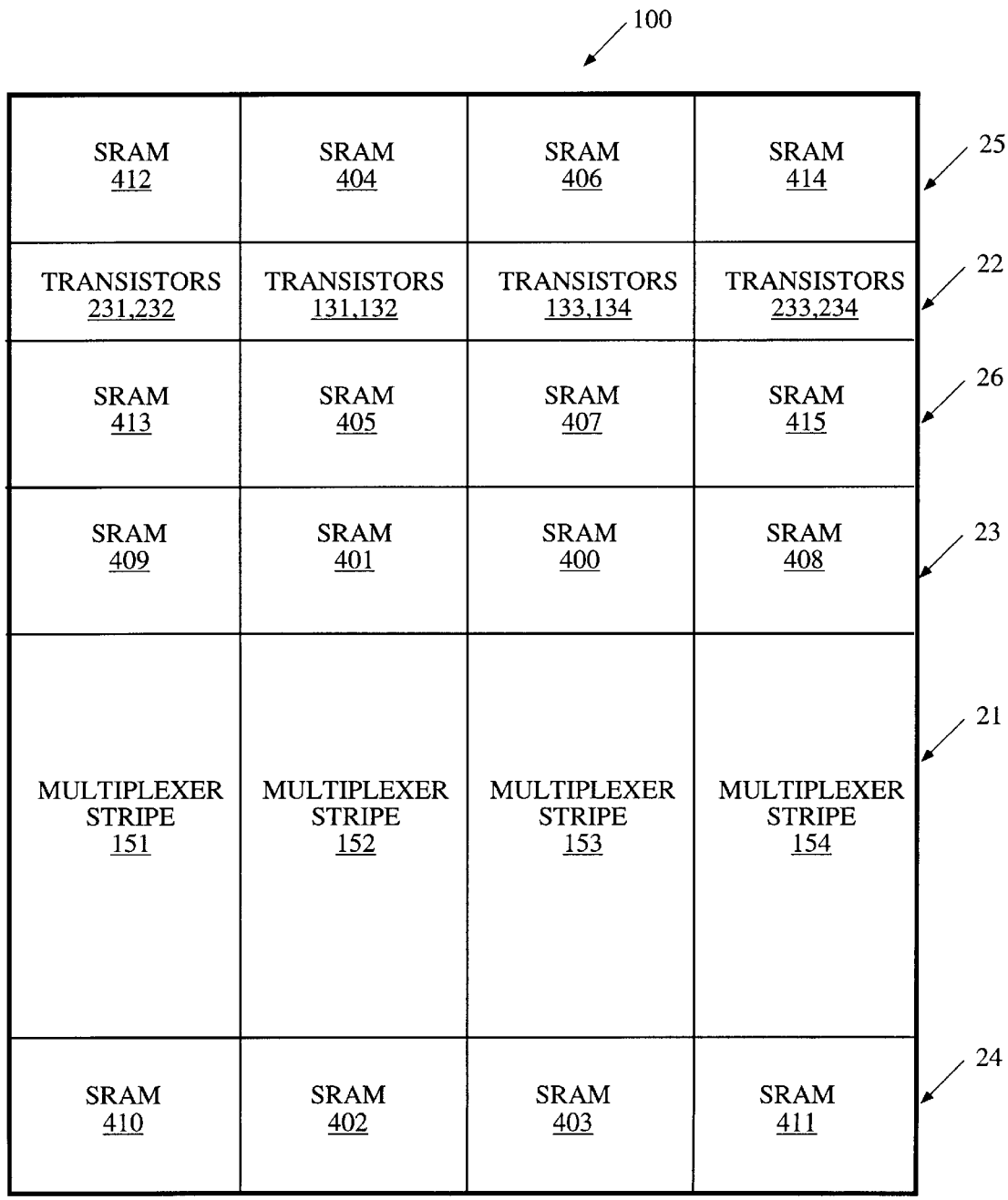
FIG. 2 is a block diagram illustrating the general layout of a multiplexer structure in accordance with one embodiment of the present invention.

FIG. 2 is a block diagram illustrating the general layout of multiplexer structure 100 in accordance with one embodiment of the present invention. In this embodiment, multiplexers 101A–101D of the first 16-to-1 multiplexer 11 are paired with corresponding multiplexers 201A–201D of the second 16-to-1 multiplexer 12 to form four multiplexer stripes 151–154. Multiplexer stripes 151–154 are illustrated in both FIG. 1 and FIG. 2. Multiplexer stripe 151 includes multiplexers 101A and 201A, multiplexer stripe 152 includes multiplexers 101B and 201B, multiplexer stripe 153 includes multiplexers 101C and 201C, and multiplexer stripe 154 includes multiplexers 101D and 201D. Multiplexer stripes 151–154 are generally rectangular, with the major axis of the rectangle extending along a first (e.g., vertical) axis. The four multiplexer stripes 151–154 are located adjacent to one another, thereby enabling multiplexers 101A–101D and 201A–201D to be fabricated in a multiplexer block 21 having compact, quadrilateral area. In this manner, the first stages of multiplexers 11 and 12 are fabricated in the same area.

As described in more detail below, SRAM cells 400–415 provide control signals $Q_0$–$Q_{15}$, respectively. SRAM cells 400–401 and 408–409 are arranged in a first memory cell row 23 that extends along a second (e.g., horizontal) axis, perpendicular to the first axis, and is located adjacent to (i.e., immediately above) multiplexer stripes 151–154. These SRAM cells are located such that multiplexer structure 100 maintains a quadrilateral shape. Similarly, SRAM cells 402–403 and 410–411 are arranged in a second memory cell row 24 extends along the second axis, and is located adjacent to (i.e., immediately below) multiplexer stripes 151–154.

Transistors 131–134 and 231–234 are arranged in a multiplexer row 22 that extends along the second axis, and is located above the first memory cell row 23. SRAM cells 404, 406, 412, and 414 are arranged in a third memory cell row 25 that extends along the second axis, and is located adjacent to (i.e., immediately above) multiplexer row 22. SRAM cells 405, 407, 413 and 415 are arranged in a fourth memory cell row 26 that extends along the second axis, and is located between the first memory cell row 23 and multiplexer row 22. Multiplexer block 21, multiplexer row 22, and memory cell rows 23–26 are fabricated to have approximately the same width along the second axis. As a result, multiplexer structure 100 maintains a quadrilateral layout shape. This shape enables efficient layout of the multiplexer structure 100 on a silicon substrate.

Figure 3:
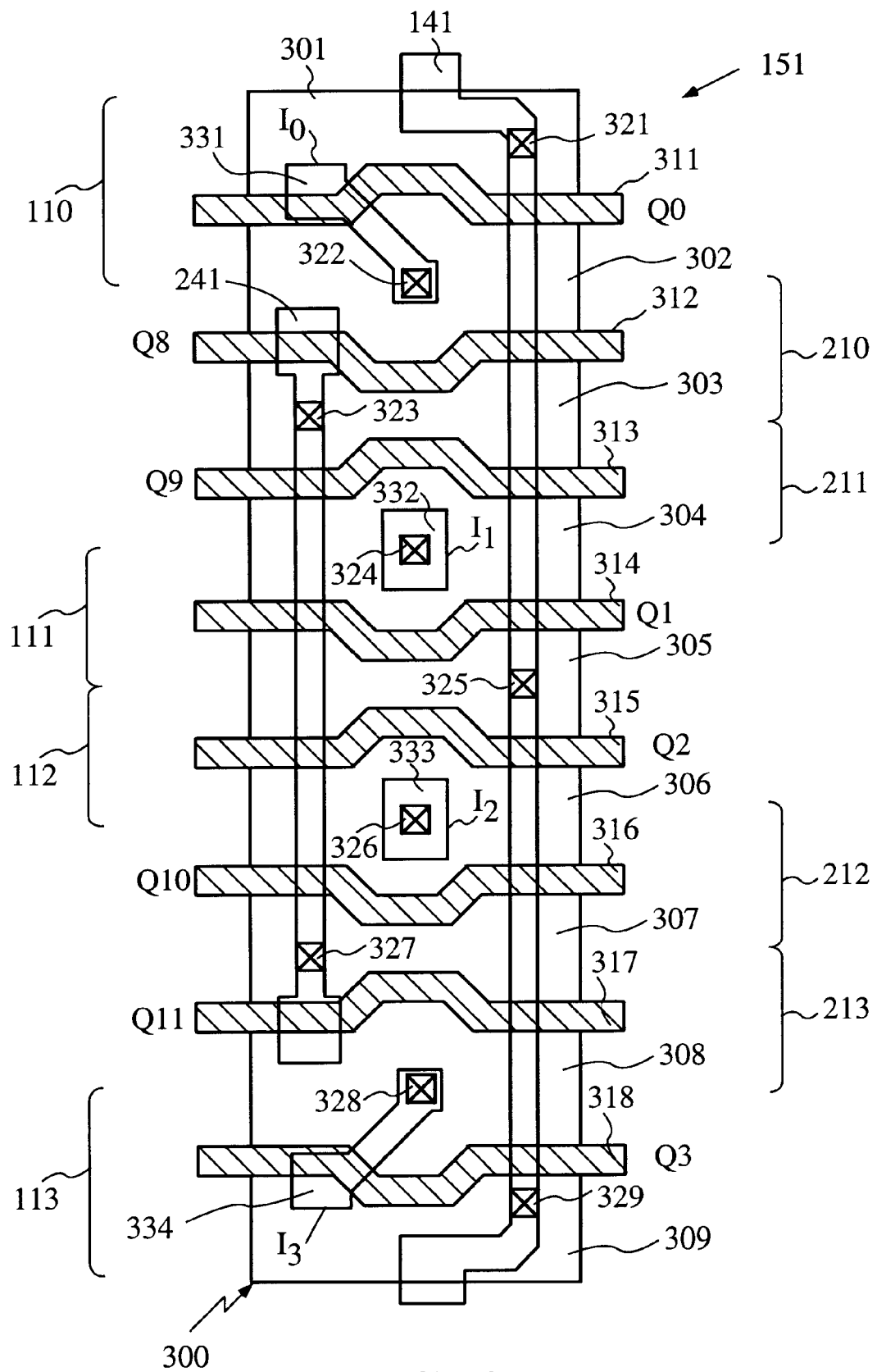
FIG. 3 is a layout diagram of a multiplexer stripe in accordance with one embodiment of the present invention.

FIG. 3 illustrates the layout of multiplexer stripe 151 in accordance with one embodiment of the present invention. Multiplexer stripe 151 includes a rectangular active region 300, which includes nine n-type source/drain regions 301–309. In the described embodiment, the n-type source/drain regions 301–309 are fabricated in a monocrystalline silicon substrate in accordance with well-known semiconductor processing techniques.

Gate electrodes 311–318 extend substantially in parallel along the second axis, over active region 300. Gate electrodes 311–318 include 45-degree bends near the locations where contacts are made to the source/drain regions 301–309 (as indicated by the boxes containing X's). These 45-degree bends reduce the area needed to implement the multiplexer stripe structure, while allowing the structure to meet the contact-to-gate spacing requirements of the design rules governing the layout. Gate electrodes 311–318 are coupled to receive control signals $Q_0$, $Q_8$, $Q_9$, $Q_1$, $Q_2$, $Q_{10}$, $Q_{11}$, and $Q_3$, respectively. It is understood that gate electrodes 311–318 are located on a gate oxide layer ($SiO_2$) that is formed over the silicon substrate. It is further understood that p-type channel regions are located in the substrate beneath gate electrodes 311–318. These elements are formed in accordance with conventional semiconductor processing techniques.

Contacts 321–329 provide electrical contact to source/drain regions 301–309, respectively, at the upper surface of the silicon substrate. Contacts 321–329 extend upward from the substrate to contact a first conductive layer that overlies (and is electrically insulated from) gate electrodes 311–318. The first conductive layer includes conductive traces 141, 241, and 331–334. Conductive traces 331–334 are coupled to contacts 322, 324, 326, and 328, respectively. Trace 141 is connected to contacts 321, 325, and 329. Trace 241 is coupled to contacts 323 and 327. Traces 331–334 are coupled to receive input signals $I_0$–$I_3$, respectively. Trace 141 corresponds to output terminal 141 of multiplexer 101A, and trace 241 corresponds to the output terminal of multiplexer 201A. (See FIG. 1.)

Multiplexer stripe 151 uses an interleaved transistor configuration. For example, transistor 110 is interleaved with transistor 210. More specifically, input signal $I_0$ is provided to source/drain region 302. From this single source/drain region, the input signal $I_0$ can be transmitted to source/drain region 301 (by asserting control signal $Q_0$ on gate electrode 311) and/or source/drain region 303 (by asserting control signal $Q_8$ on gate electrode 312). In this manner, transistors 110 and 210 share source/drain region 302. Transistors 110–113 and 210–213 are all interleaved within active region 300, thereby minimizing the layout area of multiplexer stripe 151. Multiplexer stripes 152–154 have layouts similar to multiplexer stripe 151.

Figure 4:
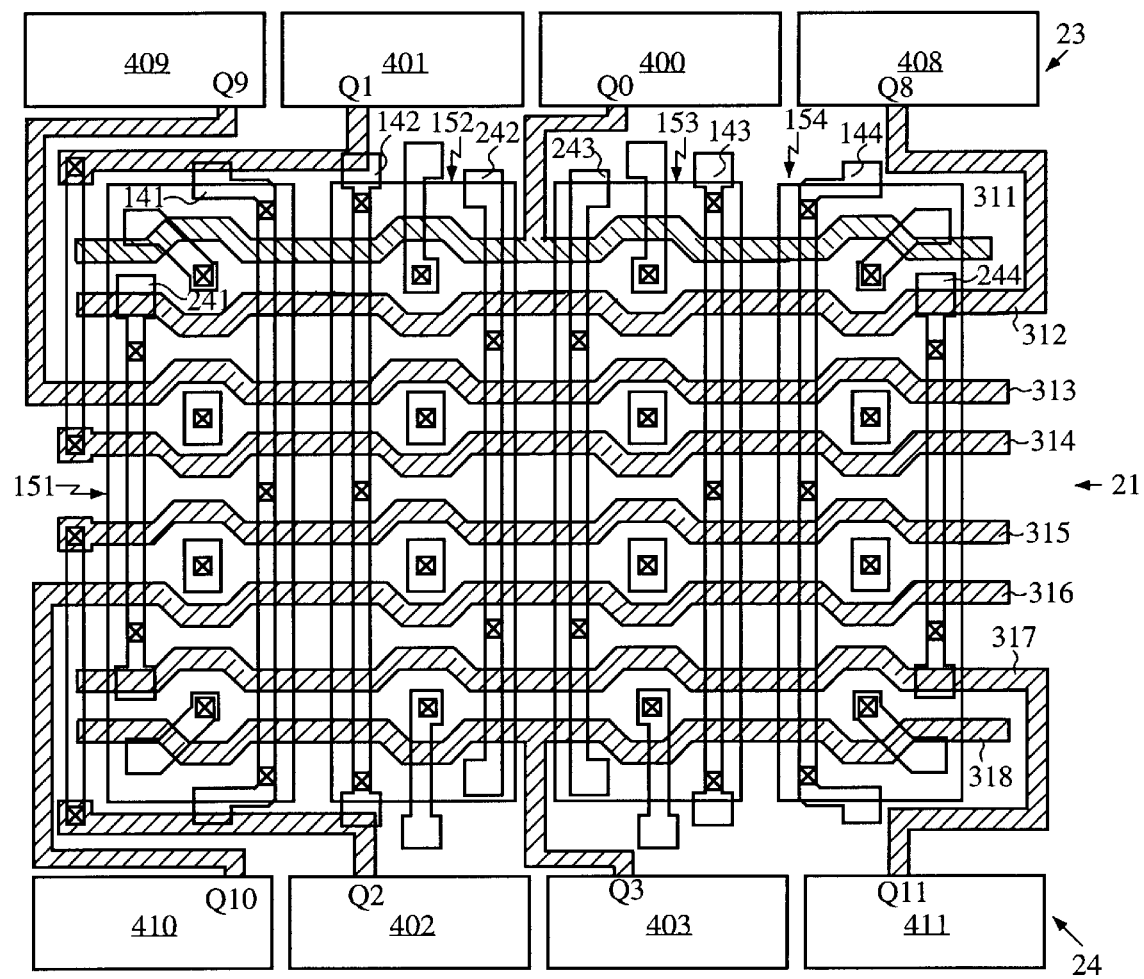
FIG. 4 is a layout diagram illustrating multiplexer stripes and associated memory cells of a first multiplexer stage in accordance with one embodiment of the invention.

FIG. 4 is a layout diagram illustrating multiplexer stripes 151–154, along with memory cells 400–403 and 408–411. Memory cells 400–403 are conventional SRAM cells that provide control signals $Q_0$–$Q_3$ to gate electrodes 311, 314, 315, and 318, respectively. Similarly, memory cells 408–411 are conventional SRAM cells that provide control signals $Q_8$–$Q_{11}$ to gate electrodes 312, 313, 316, and 317, respectively. Not all of the elements in multiplexer stripes 151–154 are labeled in FIG. 4, for purposes of clarity. However, traces 141–144 and 241–244 are labeled to identify the output terminals of multiplexers 101A–101D and 201A–201D. The connection of output terminals 141–144 and 241–244 to multiplexers 102 and 202 is described in more detail below.

Some general observations can be made with respect to FIG. 4. First, multiplexer stripe 151 is substantially a mirror image of multiplexer stripe 152. Similarly, multiplexer stripe 153 is substantially a mirror image of multiplexer stripe 154. In addition, multiplexer stripes 151–152 are substantially a mirror image of multiplexer stripes 153–154. Thus, multiplexer stripes 151–154 have a relatively regular structure.

Second, gate electrodes 311–318 extend in parallel across the four multiplexer stripes 151–154. Locating gate electrodes 311–318 in parallel helps to minimize the layout area of multiplexer structure 100.

Third, SRAM cells 400–401 and 408–409 are laid out in a horizontal memory cell row 23 (FIG. 2) that is located above multiplexer block 21. Similarly, SRAM cells 402–403 and 410–411 are laid out in a horizontal memory cell row 24 that is located below multiplexer block 21. As a result, multiplexer stripes 151–154 and SRAM cells 400–403 and 408–411 are laid out in a compact quadrilateral area.

Figure 5:
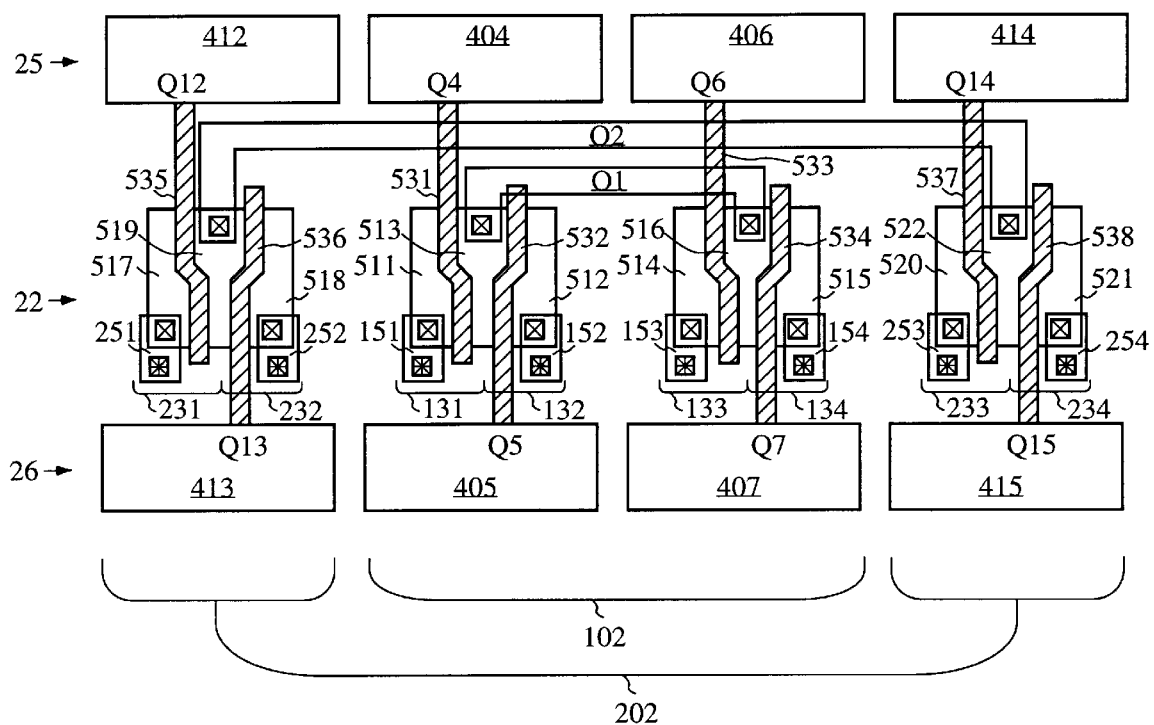
FIG. 5 is a diagram illustrating the layout of pass transistors and SRAM cells of a second multiplexer stage in accordance with one embodiment of the present invention.

FIG. 5 is a diagram illustrating the layout of pass transistors 131–134 and 231–234, and SRAM cells 404–407 and 412–415, in accordance with one embodiment of the present invention. The layout of SRAM cells 404–407 and 412–415 is largely conventional, and is not shown in FIG. 5 for purposes of clarity. As described above in connection with FIG. 1, pass transistors 131–134 and 231–234 form 4-to-1 multiplexers 102 and 202.

Pass transistors 131–132 are formed by n-type regions 511–513, which are formed in an active region of the substrate, and gate electrodes 531 and 532, which overlie a gate oxide layer and p-type channel regions (not shown). SRAM cells 404 and 405 are coupled to provide the control signals $Q_4$ and $Q_5$ to gate electrodes 531 and 532, respectively. N-type regions 511 and 512 are coupled to input traces 151 and 152, respectively, by electrically conductive contacts that extend between n-type regions 511–512 and traces 151–152. These contacts are illustrated as boxes containing X's. Similarly, n-type region 513 is coupled to output trace $O_1$ by an electrically conductive contact. In the described embodiment, traces 151, 152 and $O_1$ are formed in the first conductive layer (i.e., the same layer as output traces 141–144 and 241–244).

Transistors 131 and 132 exhibit the structure of a 2-to-1 multiplexer. Transistors 131 and 132 are interleaved, such that these transistors share a common output region (i.e., n-type region 513). This interleaved structure minimizes the required layout area of pass transistors 131 and 132.

Pass transistors 133–134 are formed in the same manner as pass transistors 131–132. Thus, pass transistors 133–134 are formed by n-type regions 514–516 and gate electrodes 533–534. Gate electrodes 533–534 are coupled to receive control signals $Q_6$ and $Q_7$ from SRAM cells 406 and 407, respectively. N-type regions 514 and 515 are coupled to input traces 153 and 154, respectively, and n-type region 516 is coupled to output trace $O_1$. Together, pass transistors 131–134 and SRAM cells 404–407 form 4-to-1 multiplexer 102 (FIG. 1). SRAM cells 404–407 are programmed such that one of the control signals $Q_4$–$Q_7$ is asserted at a logic high level, and the other three control signals are de-asserted at a logic low level. As a result, one of the four input signals received on input traces 151–154 is routed to output trace $O_1$.

Pass transistors 231–232 and 233–234 are formed in the same manner as pass transistors 131–132 and 133–134. More specifically, pass transistors 231–232 and 233–234 include n-type regions 517–522, gate electrodes 535–538, and input traces 251–254, as illustrated. Gate electrodes 535–538 are coupled to receive control signals $Q_{12}$–$Q_{15}$ from SRAM cells 412–415, respectively. N-type regions 519 and 522 are commonly connected to output trace $O_2$. Pass transistors 231–234 form a 4-to-1 multiplexer 202 that is controlled in the same manner as 4-to-1 multiplexer 102.

Transistors 131–134 and 231–234 are laid out in a multiplexer row 22 that extends along the second axis (FIG. 2). SRAM cells 404, 406, 412, and 414 are laid out in a memory cell row 25 that extends along the second axis, adjacent to multiplexer row 22. Similarly, SRAM cells 405, 407, 413, and 415 are laid out in a memory cell row 26 that extends along the second axis, adjacent to multiplexer row 22. The horizontal width of multiplexer row 22 is approximately equal to the horizontal width of memory cell rows 25 and 26. As a result, transistors 131–134 and 231–234, and SRAM cells 404–407 and 412–415, are laid out in a compact, quadrilateral area on the substrate.

Figure 6:
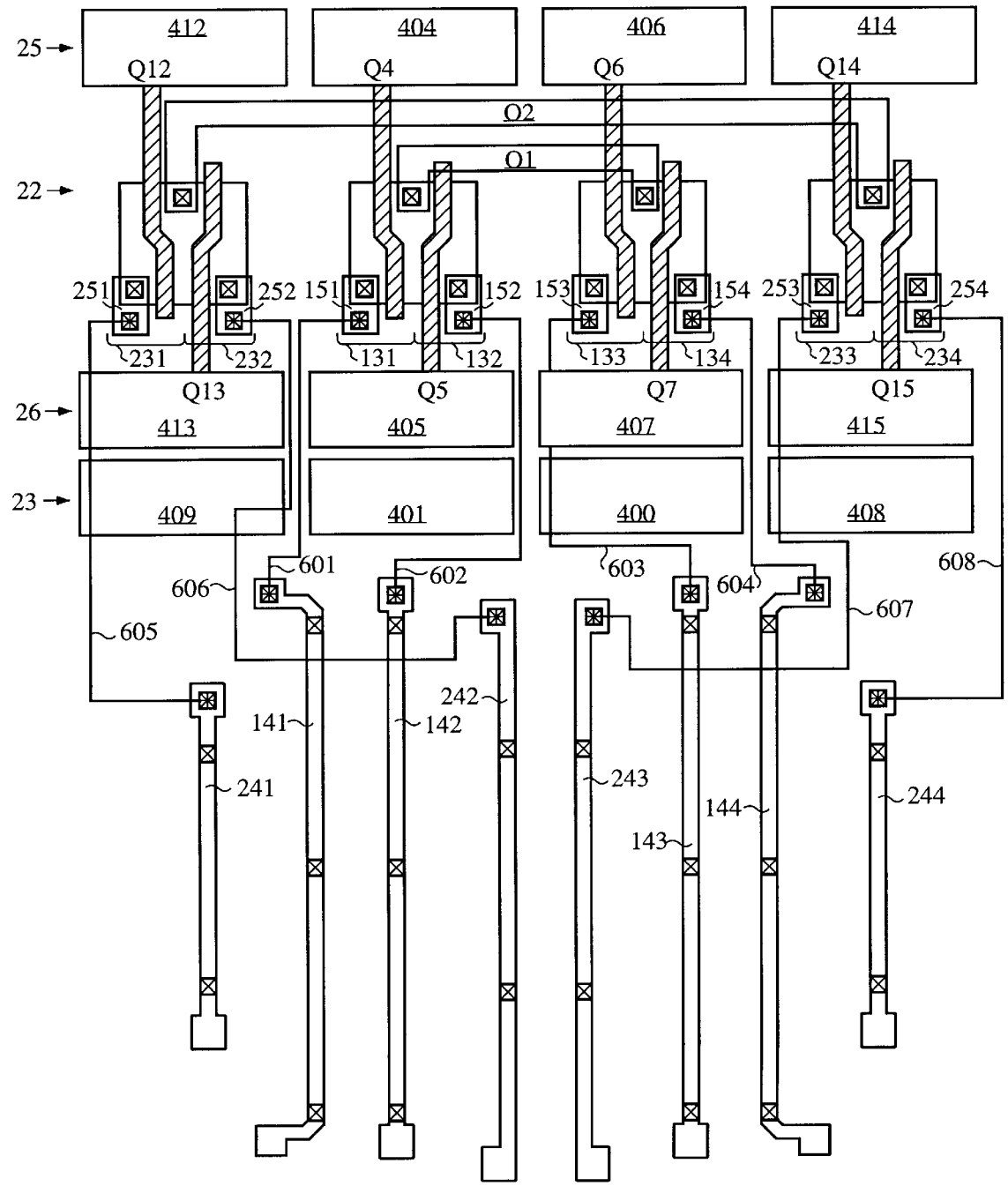
FIG. 6 is a layout diagram that illustrates the interconnection of output traces of multiplexers of the first multiplexer stage to input traces of multiplexers of the second multiplexer stage in accordance with one embodiment of the present invention.

FIG. 6 is a layout diagram that illustrates the interconnection of output traces 141–144 and 241–244 of multiplexers 101A–101D and 201A–201D to input traces 151–154 and 251–254 of multiplexers 102 and 202 in accordance with one embodiment of the present invention. FIG. 6 shows output traces 141–144 and 241–244 of multiplexer stripes 151–154, which are described above in connection with FIGS. 3 and 4. The other elements of multiplexer stripes 151–154 are not shown in FIG. 6 for purposes of clarity. SRAM cells 400–401 and 408–409 of memory cell row 23 are illustrated, as well as SRAM cells 404–407 and 412–415 of memory cell rows 25 and 26, thereby showing the relative locations of these elements.

Traces 601–608 couple the output traces 141–144 and 241–244 to the input traces 151–154 and 251–254 as illustrated. Traces 601–608 are formed in a second conductive layer, which is located over the first conductive layer. Electrically conductive via plugs (represented by boxes containing asterisks) connect the first conductive layer to the second conductive layer. Thus, trace 601 connects output trace 141 of multiplexer 101A to input trace 151 of transistor 131. Traces 602–608 connect output traces 142–144 and 241–244 to input traces 152–154 and 251–254, respectively.

Although the present invention has been described in accordance with a particular layout, it is understood that this layout can be modified by one of ordinary skill, without departing from the scope of the present invention. For example, the horizontal order of multiplexer stripes 151–154 can be modified in other embodiments. Similarly, the vertical order of the interleaved transistors in multiplexer stripes 151–154 can be modified. Moreover, the horizontal order of transistors 131–134 and 231–234 in multiplexer row 22 can be modified in other embodiments. For example, transistors 131–134 could be laid out adjacent to one another, and transistors 231–234 could be laid out adjacent to one another. Such modifications would require corresponding modifications to the interconnect traces. In addition, the output traces $O_1$ and $O_2$ illustrated in FIG. 5, which were described as being part of a first conductive layer, can be replaced with interconnect traces in a second conductive layer (e.g., the same conductive layer that includes traces 601–608 in FIG. 6).

Figure 7:
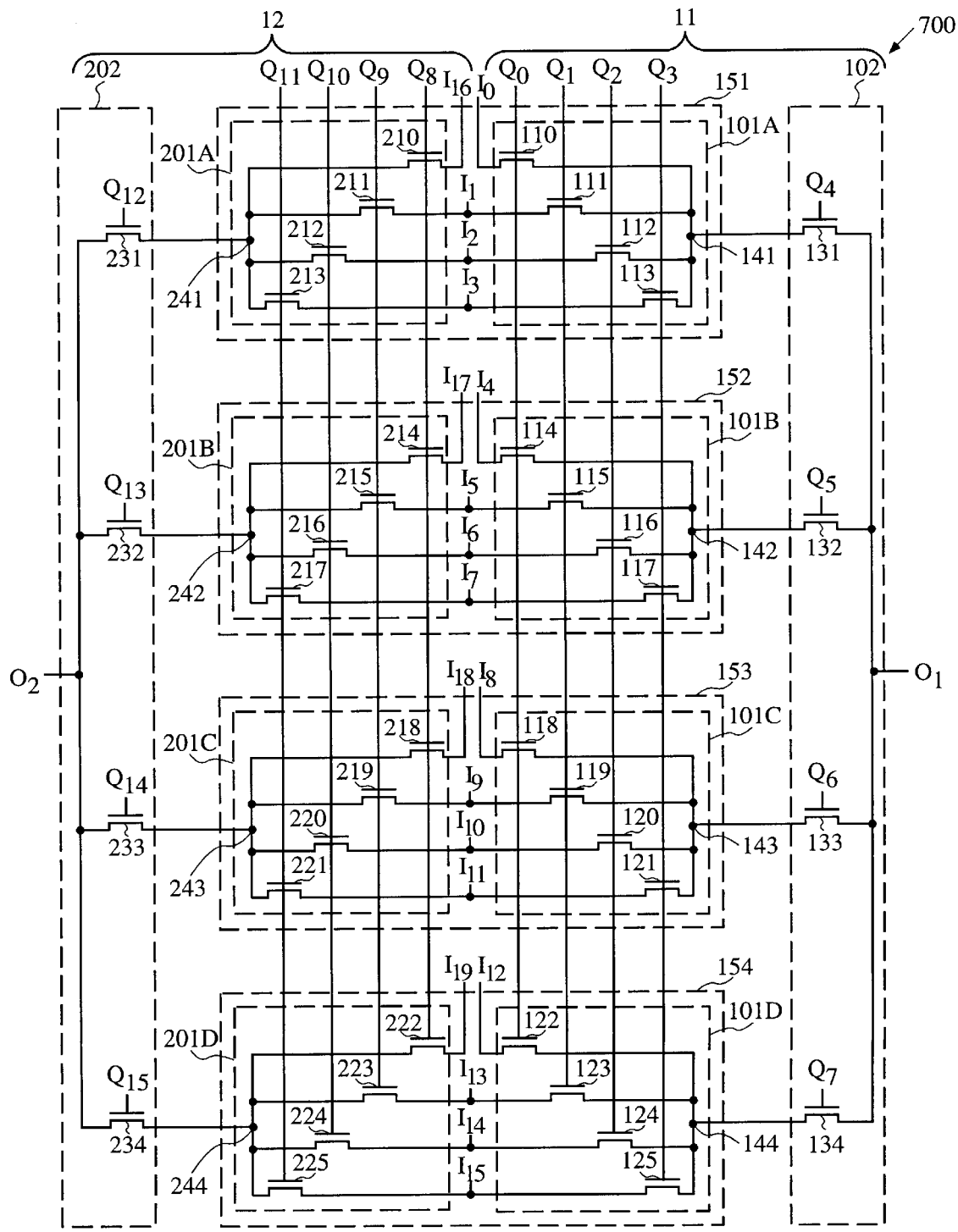
FIG. 7 is a schematic diagram of a multiplexer structure in accordance with another embodiment of the present invention.

FIG. 7 is a schematic diagram of a multiplexer structure 700 in accordance with another embodiment of the present invention. Because multiplexer structure 700 is similar to multiplexer structure 100 (FIG. 1), similar elements in FIGS. 1 and 7 are labeled with similar reference numbers.

As illustrated in FIG. 7, pass transistors 210, 214, 218, and 222 are coupled to receive signals $I_{16}$, $I_{17}$, $I_{18}$, and $I_{19}$, respectively (rather than input signals $I_0$, $I_4$, $I_8$, and $I_{12}$). As a result, the first 16-to-1 multiplexer 11 receives input signals $I_0$–$I_{15}$, and the second 16-to-1 multiplexer 12 receives input signals $I_1$–$I_3$, $I_5$–$I_7$, $I_9$–$I_{11}$, $I_{13}$–$I_{15}$, and $I_{16}$–$I_{19}$. The first 16-to-1 multiplexer 11 and the second 16-to-1 multiplexer 12 therefore receive twelve common input signals and four unique input signals. This configuration enables multiplexers 11 and 12 to select from different input signals.

Figure 8:
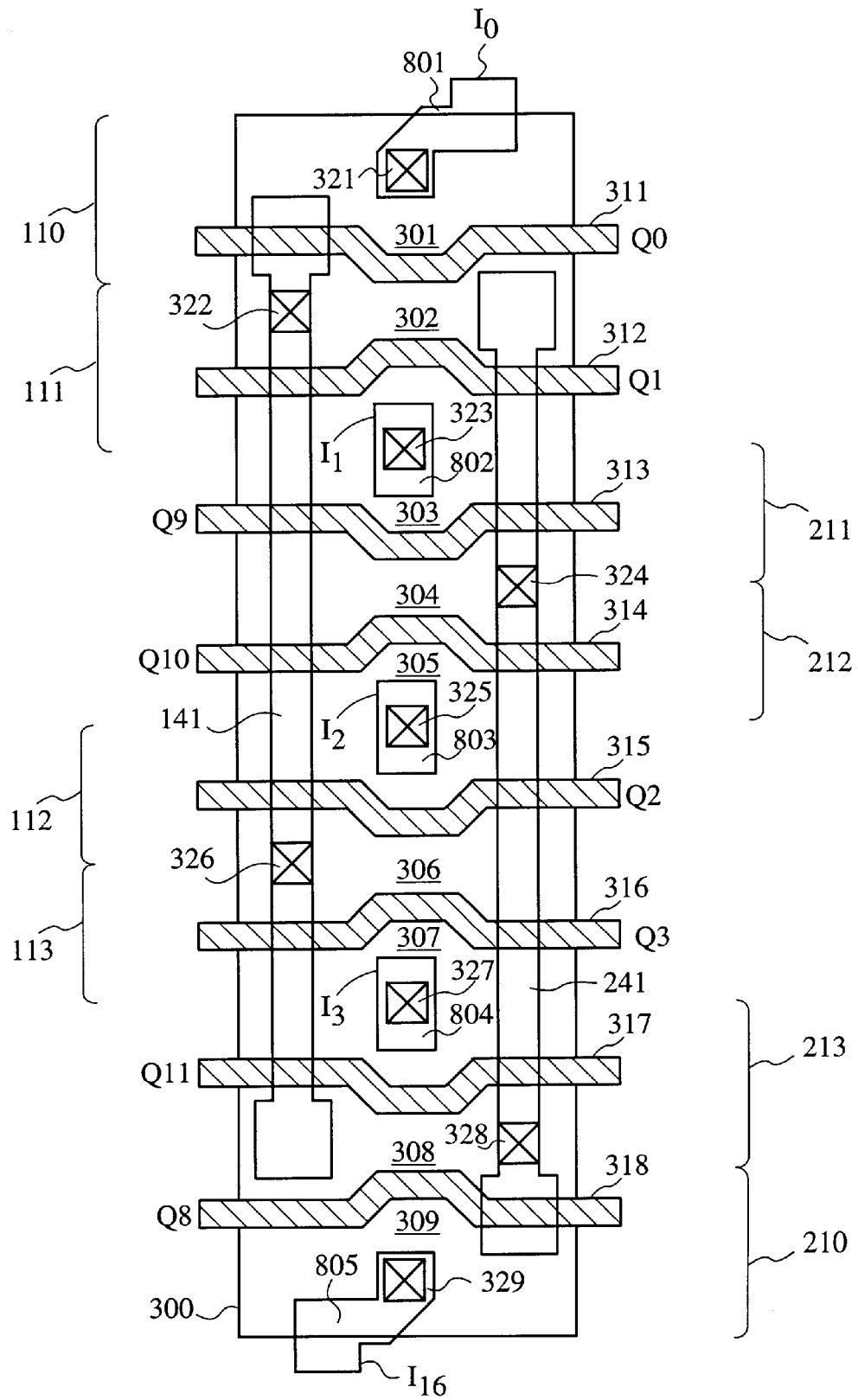
FIG. 8 is a layout diagram illustrating a multiplexer stripe of the multiplexer structure of FIG. 7 in accordance with one embodiment of the present invention.

FIG. 8 is a layout diagram illustrating multiplexer stripe 151 of multiplexer structure 700 in accordance with one embodiment of the present invention. Because multiplexer stripe 151 of multiplexer structure 700 is similar to multiplexer stripe 151 of multiplexer structure 100 (FIG. 3), similar elements in FIGS. 3 and 8 are labeled with similar reference numbers. Thus, multiplexer stripe 151 of multiplexer structure 700 includes active region 300, n-type regions 301–309, gate electrodes 311–318 and contacts 321–329. Note that the 45-degree angles of gate electrodes 311–318 are reversed in multiplexer stripe 151 of multiplexer structure 700. Other differences between the multiplexer stripes are found in the traces 801–805 of the first interconnect layer, the manner in which the input signals $I_0$–$I_3$ and $I_{16}$ are applied to the traces of the first interconnect layer, and the manner in which the control signals $Q_0$–$Q_3$ and $Q_8$–$Q_{11}$ are applied to the gate electrodes 311–318.

More specifically, trace 801 is coupled to provide input signal $I_0$ to contact 321. Trace 802 is coupled to provide input signal $I_1$ to contact 323. Trace 803 is coupled to provide input signal $I_2$ to contact 325. Trace 804 is coupled to provide input signal $I_3$ to contact 327. Trace 805 is coupled to provide input signal $I_{16}$ to contact 329.

Contacts 322 and 326 are commonly coupled to output trace 141. Similarly, contacts 324 and 328 are commonly coupled to output trace 241.

Gate electrodes 311–318 are coupled to receive control signals $Q_0$, $Q_1$, $Q_9$, $Q_{10}$, $Q_2$, $Q_3$, $Q_{11}$ and $Q_8$, respectively. In order to accomplish this coupling, SRAM cells 400–403 and 408–411 are programmed to provide control signals Q0, Q10, Q2, Q8, Q1, Q9, Q3, and Q11, respectively. As a result of this configuration, the order of transistors 110–113 and 210–213 in multiplexer stripe 151 of multiplexer structure 700 (FIG. 7) is different from the order of transistors 110–113 and 210–213 in multiplexer stripe 151 of multiplexer structure 100 (FIG. 1). However, because both multiplexer stripes are fabricated in identical active regions 300, the layout area of the multiplexer stripes of the two embodiments is the same. Multiplexer stripes 152–154 of multiplexer structure 700 are laid out in a manner similar to multiplexer stripe 151. As a result, multiplexer structure 700 exhibits the same layout advantages described above for multiplexer structure 100.

Although the invention has been described in connection with several embodiments, it is understood that this invention is not limited to the embodiments disclosed, but is capable of various modifications that would be apparent to a person skilled in the art. For example, although the present invention is described in connection with a multiplexer structure having two 16-to-1 multiplexers, it is understood that the present invention can be extended to multiplexer structures having other sizes. For example, larger multiplexer structures can be constructed by making the multiplexer stripes larger or increasing the number of multiplexer stripes. In a particular variation, two 32-to-1 multiplexers are formed by replicating the layout of multiplexer structure 100. In this variation, there are eight adjacent memory stripes in the first multiplexer stage. Smaller multiplexer structures can also be formed, by making the multiplexer stripes smaller or decreasing the number of multiplexer stripes. In a particular variation, two 8-to-1 multiplexers are formed by eliminating half of the layout of multiplexer structure 100. In this variation, there are two adjacent memory stripes in the first multiplexer stage. In addition, although the invention has been described in connection with multiplexers having two stages, it is understood that multiplexers having other numbers of stages can be implemented in accordance with the present invention. Moreover, although the multiplexer structure of the present invention has been described as being useful in an FPGA, it is understood that the present invention is applicable to other programmable devices, such as complex programmable logic devices (CPLDs). This multiplexer structure can also be used in other types of integrated circuits. Thus, the invention is limited only by the following claims.

What is claimed is:

1. A multiplexer structure, comprising:

a plurality of multiplexer stripes fabricated adjacent to one another in a semiconductor substrate, each of the multiplexer stripes comprising a plurality of interleaved transistors, each of the plurality of interleaved transistors sharing a source/drain region with an adjacent one of the plurality of interleaved transistors, wherein the multiplexer stripes form a first stage of a first multiplexer and a first stage of a second multiplexer; and a plurality of pass transistors forming a second stage of the first multiplexer and a second stage of the second multiplexer.

2. The multiplexer structure of claim 1, further comprising a first row of memory cells fabricated adjacent to the multiplexer stripes, wherein the first row of memory cells controls a first set of interleaved transistors in each of the multiplexer stripes.

3. The multiplexer structure of claim 2, further comprising a second row of memory cells fabricated adjacent to the multiplexer stripes, wherein the second row of memory cells controls a second set of interleaved transistors in each of the multiplexer stripes.

4. The multiplexer structure of claim 3, wherein the plurality of pass transistors form a multiplexer row, and wherein the multiplexer stripes, the first row of memory cells, the multiplexer row and the second row of memory cells each have a quadrilateral layout area, and the multiplexer structure has a quadrilateral layout area.

5. The multiplexer structure of claim 3, wherein the plurality of pass transistors form a multiplexer row, further comprising a third row of memory cells fabricated adjacent to the multiplexer row, wherein the third row of memory cells controls a first group of pass transistors in the multiplexer row.

6. The multiplexer structure of claim 5, further comprising a fourth row of memory cells fabricated memory cells controls a second group of pass transistors in the multiplexer row.

7. The multiplexer structure of claim 1, wherein the first multiplexer and the second multiplexer receive the same input signals.

8. The multiplexer structure of claim 1, wherein the first multiplexer and the second multiplexer receive at least one common input signal and at least one unique input signal.

9. The multiplexer structure of claim 2, wherein the memory cells are static random access memory (SRAM) cells.

10. The multiplexer structure of claim 1, wherein the multiplexer stripes comprise:

a plurality of active regions that extend in parallel with each other along a first axis of the substrate; and a plurality of gate electrodes of the interleaved transistors that extend in parallel with each other along a second axis of the substrate, the first axis being perpendicular to the second axis.

* * * * *